(12) United States Patent
Aisenbrey

(10) Patent No.: US 6,947,005 B2
(45) Date of Patent: Sep. 20, 2005

(54) LOW COST ANTENNAS AND ELECTROMAGNETIC (EMF) ABSORPTION IN ELECTRONIC CIRCUIT PACKAGES OR TRANSCEIVERS USING CONDUCTIVE LOADED RESIN-BASED MATERIALS

(75) Inventor: Thomas Aisenbrey, Littleton, CO (US)

(73) Assignee: Integral Technologies, Inc., Bellingham, WA (US)

( * ) Notice: Subject to any disclaimer, the term of this patent is extended or adjusted under 35 U.S.C. 154(b) by 50 days.

(21) Appl. No.: 10/780,214

(22) Filed: Feb. 17, 2004

(65) Prior Publication Data

US 2004/0160377 A1 Aug. 19, 2004

Related U.S. Application Data

(63) Continuation-in-part of application No. 10/309,429, filed on Dec. 4, 2002, now Pat. No. 6,870,516, which is a continuation-in-part of application No. 10/075,778, filed on Feb. 14, 2002, now Pat. No. 6,741,221.
(60) Provisional application No. 60/447,825, filed on Feb. 14, 2003, provisional application No. 60/317,808, filed on Sep. 7, 2001, provisional application No. 60/269,414, filed on Feb. 16, 2001, and provisional application No. 60/268,822, filed on Feb. 15, 2001.

(51) Int. Cl.$^7$ ............................................. H01Q 13/10
(52) U.S. Cl. ..................... 343/789; 343/702; 343/872; 343/873
(58) Field of Search ..................... 343/700 MS, 702, 343/711, 713, 789, 793, 795, 829, 830, 846, 872, 873, 912, 915

(56) References Cited

U.S. PATENT DOCUMENTS

| | | | |
|---|---|---|---|
| 4,134,120 A | | 1/1979 | DeLoach et al. ............ 343/715 |
| 4,612,940 A | * | 9/1986 | Kasevich et al. ............ 607/154 |
| 4,656,483 A | * | 4/1987 | Jaquet ......................... 343/745 |
| 5,771,027 A | | 6/1998 | Marks et al. ................ 343/912 |
| 6,249,261 B1 | | 6/2001 | Solberg, Jr. et al. ........ 343/801 |
| 6,320,753 B1 | | 11/2001 | Launay ........................ 361/760 |
| 6,531,983 B1 | | 3/2003 | Hirose et al. ........ 343/700 MS |
| 6,617,976 B2 | | 9/2003 | Walden et al. ......... 340/870.02 |
| 6,697,248 B1 | * | 2/2004 | Luch ........................... 361/220 |
| 2002/0109634 A1 | | 8/2002 | Aisenbrey ............ 343/700 MS |

FOREIGN PATENT DOCUMENTS

| | | | |
|---|---|---|---|
| EP | 0117700 A | 2/1984 | ............ H01B/1/22 |
| EP | 1233426 A | 8/2002 | ............ H01B/1/22 |
| GB | 2377449 A | 7/2001 | ............ C08K/3/08 |
| JP | 02250203 | 10/1990 | ............ H01B/1/02 |
| JP | 07162220 | 12/1993 | ............ H01Q/1/38 |
| JP | 06231869 | 8/1994 | ............ H05B/3/14 |
| JP | 00169641 | 12/1998 | ............ C08L/23/08 |

OTHER PUBLICATIONS

Co–Pending U.S. Patent INT–01–002–CIP, filed Dec. 14, 2002, U.S. Appl. No. 10/309,429, assigned to the same assignee.
"Low Cost Antennas Using Conductive Plastics or Conductive Composites".

* cited by examiner

Primary Examiner—Tho Phan
(74) Attorney, Agent, or Firm—George O. Saile; Stephen B. Ackerman; Larry J. Prescott

(57) ABSTRACT

Low cost antennas and electromagnetic absorbing parts formed of a conductive loaded resin-based material. The conductive loaded resin-based material comprises conductive fibers, conductive powders, or in combination thereof in a resin base host wherein the ratio of the weight of the conductor fibers, conductor powders, or combination of conductor fibers and conductor powders to the weight of the base resin host is between about 0.20 and 0.40. The conductive fibers or conductive powders can be stainless steel, nickel, copper, silver, carbon, graphite, plated fibers or particles, or the like. The antenna elements can be formed using methods such as injection molding or extrusion. Virtually any antenna, ground planes, or shielding packages fabricated by conventional means of metal can be fabricated using the conductive loaded resin-based materials. The conductive loaded resin-based material used to form the antenna elements, EMF absorbing elements, or ground planes can be in the form of a thin flexible material, which can be readily cut to the desired shape.

40 Claims, 12 Drawing Sheets

LOW COST ANTENNAS AND ELECTROMAGNETIC (EMF) ABSORPTION IN ELECTRONIC CIRCUIT PACKAGES OR TRANSCEIVERS USING CONDUCTIVE LOADED RESIN-BASED MATERIALS

This application claims priority to the U.S. Provisional Patent Application No. 60/447,825, filed Feb. 14, 2003, which is herein incorporated by reference in its entirety.

This Patent Application is a Continuation-in-Part application of filed as U.S. patent application Ser. No. 10/309,429, filed on Dec. 4, 2002 now U.S. Pat. No. 6,870,516 also incorporated by reference in its entirety, which is a Continuation-in-Part application of filed as U.S. patent application Ser. No. 10/075,778, filed on Feb. 14, 2002 now U.S. Pat. No. 6,741,221 which claimed priority to U.S. Provisional Patent Applications Ser. No. 60/317,808, filed on Sep. 7, 2001, Ser. No. 60/269,414, filed on Feb. 16, 2001, and Ser. No. 60/268,822, filed on Feb. 15, 2001.

BACKGROUND OF THE INVENTION (1) Field of the Invention

This invention relates to antennas and EMF/RFI absorbers or the like molded of conductive loaded resin-based materials comprising micron conductive powders, micron conductive fibers, or a combination thereof, homogenized within a base resin when molded.

(2) Description of the Related Art

U.S. Pat. No. 4,134,120 to DeLoach et al. describes antennas formed from fiber reinforced resin material.

U.S. Pat. No. 5,771,027 to Marks et al. describes a composite antenna having a grid comprised of electrical conductors woven into the warp of a resin reinforced cloth forming one layer of a multi-layer laminate structure of an antenna.

U.S. Pat. No. 6,249,261 B1 to Solberg, Jr. et al. describes a direction-finding material constructed from polymer composite materials, which are electrically conductive.

U.S. Pat. No. 6,531,983 B1 to Hirose et al. describes a dielectric antenna wherein a circuit pattern is formed of a conductive film or resin.

U.S. Pat. No. 6,320,753 B1 to Launay describes forming an antenna using silk-screen printing of a conductive ink or a conductive resin.

U.S. Pat. No. 6,617,976 B1 to Walden et al. teaches, without providing details, that an antenna could be formed of conductive plastics.

SUMMARY OF THE INVENTION

Antennas and EMF Absorbers are an essential part of electronic communication systems that contain wireless links and electronic manufacturing capabilities. Low cost molded antennas and EMF absorbers offer significant advantages for these systems not only from a fabrication standpoint, but also characteristics related to 2D, 3D, 4D, and 5D electrical characteristics, which include the physical advantages that can be achieved by the molding process of the actual parts and the polymer physics within the conductive networks formed within the molded part.

Antennas and electromagnetic absorption are essential elements in electronic devices and wireless transceivers. Such applications as communications and navigation require reliable sensitive antennas and proper chip set and electronic component isolation either by shielding or as in with this material isolation via EMF absorption. Antennas and shielding (chip/component isolation) are typically fabricated from metals in a wide variety of configurations. Lowering the materials and or fabrication costs combined with added performance for antennas and/or absorbers/shielding (shielding as known when made from metals) offer significant advantages for many system design applications utilizing antennas or electromagnetic absorbers (as when made from conductive loaded resin based materials).

It is a principle objective of this invention to provide a case or shell for wireless communication device(s) and/or transceiver(s) using next generation moldable antenna(s) and/or electromagnetic absorber(s), which can be designed and fabricated from conductive loaded resin-based materials. Antenna(s) and absorber(s) when molded may become part or all of the structure of the body or case of the device, or used in unison in all or part of the circuit board design, manufacturing and assembly of these devices.

It is another principle objective to provide a package for electronic circuit devices using next generation electromagnetic absorbers, which can be designed and fabricated from conductive loaded resin-based materials. These absorbers can be molded or extruded and may become part or all of the structure of the package, or used in unison in all or part of the design, manufacturing and assembly of these packages.

These objectives are achieved by molding the antenna elements and or electronic device and or EMF chip isolation design that may be required within the wireless communication device(s) or electronic device(s), from conductive loaded resin-based materials. These materials are base resins loaded with conductive materials, which then makes any base resin a conductor rather than an insulator. The resins provide the structural integrity to the molded part. The micron conductive fibers, micron conductive powders, or a combination thereof are homogenized within the resin during the molding process.

Any type of antenna can be produced from the conductive loaded resin-based materials. Examples of common antennas are, dipole antennas, monopole antennas, planar antennas, inverted F antennas, pifa's or the like. These antennas can be tuned using mathematical equation multiples to achieve a desired frequency range.

The conductive loaded resin-based materials can be molded, extruded or the like to provide almost any desired shape or size. The molded conductive loaded resin-based materials can also be cut, stamped, vacuumed formed from an injection molded sheet or part, over-molded, laminated, milled or the like to provide the desired antenna or absorber shape and size. The electrical characteristics of antennas fabricated using conductive loaded resin-based materials, depend on the composition of the conductive loaded resin-based materials, of which the loading parameters can be adjusted to aid in achieving the desired antenna and or structural and or electrical characteristics. Virtually any antenna fabricated by conventional means such as wire, strip-line, printed circuit boards, or the like can be fabricated using the conductive loaded resin-based materials.

DESCRIPTION OF THE PREFERRED EMBODIMENTS

Figure 1:
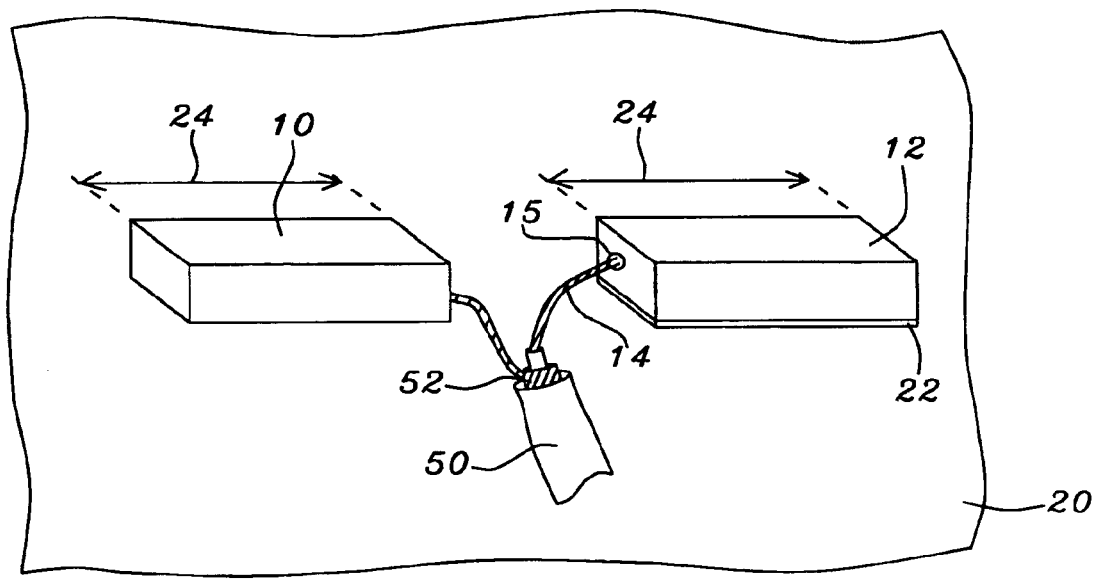
FIG. 1 shows a perspective view of a dipole antenna formed from a conductive loaded resin-based material.

The following embodiments are examples of antennas, ground planes, and electromagnetic absorber isolation, fabricated using conductive loaded resin-based materials. In some of the examples the ground planes can be formed of either conductive loaded resin-based materials or in combination or unison with metals such as circuit boards traces or the like contained within the device as a counterpoise. The use of conductive loaded resin-based materials in the fabrication of antennas, ground planes, and electromagnetic absorber packages significantly lowers the cost of materials and manufacturing processes used and the ease of forming these materials into the desired shapes. These materials can be used to manufacture either receiving or transmitting antennas and any combination of antennas and/or absorbers. The antennas, ground planes, and EMF absorbers can be formed in infinite shapes using conventional methods such as injection molding, over-molding, thermo-set, protrusion, extrusion, compression or the like of the then homogenized processed conductive loaded resin-based materials.

The conductive loaded resin-based materials when molded typically but not exclusively produce a desirable usable range of conductivity of between from <5 and up to >25 ohms per square. The selected materials used to build the antennas or EMF materials, are homogenized together using molding techniques and/or methods such as injection molding, over-molding, thermo-set, protrusion, extrusion, compression, or the like.

The conductive loaded resin-based materials comprise micron conductive powders, micron conductive fibers, or in any combination thereof. These are homogenized together within the resin, during the molding process, yielding an easy to produce low cost, electrically conductive, close tolerance manufactured part or circuit. The micron conductive powders can be of carbons, graphite's, amines or the like, and/or of metal powders such as nickel, copper, silver, or plated or the like. The use of carbons or other forms of powders such as graphite(s) etc. can create additional low activity level electron exchange and, when used in combination with micron conductive fibers, a micron filler element within the micron conductive network of fiber(s) producing further electrical conductivity as well as acting as a lubricant for the molding equipment. The micron conductive fibers can be nickel plated carbon fiber, stainless steel fiber, copper fiber, silver fiber, or the like. The structural material is a material such as any polymer resin. Structural material can be, here given as examples and not as an exhaustive list, polymer resins produced by GE PLASTICS, Pittsfield, Mass., a range of other resins produced by GE PLASTICS, Pittsfield, Mass., a range of other resins produced by other manufacturers, silicones produced by GE SILICONES, Waterford, N.Y., or other flexible resin-based compounds produced by other manufacturers.

The resin-based structural material loaded with micron conductive powders, micron conductive fibers, or in combination thereof can be molded, using methods such as injection molding or overmolding, or extruded to the desired shapes. The molded conductive loaded resin-based materials can be stamped, cut or milled as desired to form the desired shape of the antenna elements. The composition and directionality of the loaded materials can affect the antenna(s) characteristics and can be precisely controlled in and during the molding process. A laminated composite could also be in the family with random webbed micron stainless steel fibers or other micron conductive fibers forming a cloth like material which, when properly designed in metal content and shape, can be used to realize a very high performance flexible cloth-like antenna. Such a cloth-like antenna could be embedded in a persons clothing as well as in insulating materials such as rubber or plastic. The random webbed conductive fiber can be laminated or the like to materials such as Teflon, Polyesters, or any resin-based flexible or solid material polymer. When using conductive fibers as a webbed conductor material as part of a laminate the fibers may have diameters of between about 3 and 12 microns, typically between about 8 and 12 microns or in the range of 10 microns with length(s) that can be seamless.

Refer now to FIGS. 1–10B for examples of antennas fabricated using conductive loaded resin-based materials. These antennas can be either receiving or transmitting antennas. FIG. 1 shows a perspective drawing of a dipole antenna with a radiating antenna element 12 and a counterpoise antenna element 10 formed from conductive loaded resin-based materials. The antenna comprises a radiating antenna element 12 and a counterpoise antenna element 10 each having a length 24 and a rectangular cross section perpendicular to the length 24. The length 24 is greater than three multiplied by the square root of the cross sectional area. The center conductor 14 of a coaxial cable 50 is electrically connected to the radiating antenna element 12 using a solderable metal insert 15 formed in the radiating antenna element 12. The shield 52 of the coaxial cable 50 is connected to the counterpoise antenna element 10 using a solderable metal insert formed or insert molded in the counterpoise antenna element 10. The metal insert in the counterpoise antenna element 10 is not visible in FIG. 1 but is the same as the metal insert 15 in the radiating antenna element 12. The length 24 is a multiple of a quarter wavelength of the optimum frequency of detection or transmission of the antenna. The impedance of the antenna at resonance should be very nearly equal to the impedance of the coaxial cable 50 to assure maximum power transfer between cable and antenna.

Figure 3:
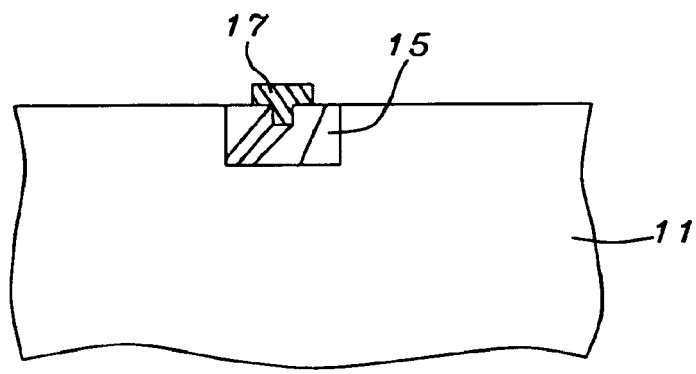
FIG. 3 shows a segment of an antenna element formed from a conductive loaded resin-based material showing a metal insert for connecting to conducting cable elements.

FIG. 3 shows a detailed view of a metal insert 15 formed in a segment 11 of an antenna element. The metal insert can be copper or other metal(s). A screw 17 can be used in the metal insert 15 to aid in electrical connections. Soldering or other electrical connection methods can also be used.

FIG. 1 shows an example of a dipole antenna with the radiating antenna element 12 placed on a layer of insulating material 22, which is placed on a ground plane 20, and the counterpoise antenna element 10 placed directly on the ground plane 20. The ground plane 20 is optional and if the ground plane is not used the layer of insulating material 22 may not be necessary. As another option the counterpoise antenna element 10 can also be placed on a layer of insulating material 22, see FIG. 2A. If the ground plane 20 is used it can also be formed of the conductive loaded resin-based materials.

Figure 2A:
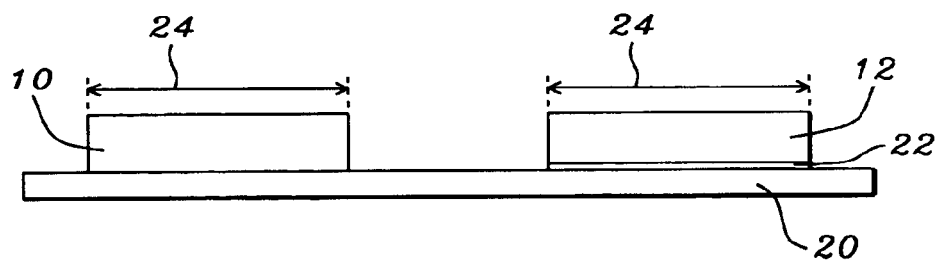
FIG. 2A shows a front view of the dipole antenna of FIG. 1 showing insulating material between the radiating antenna element and a ground plane.
Figure 2B:
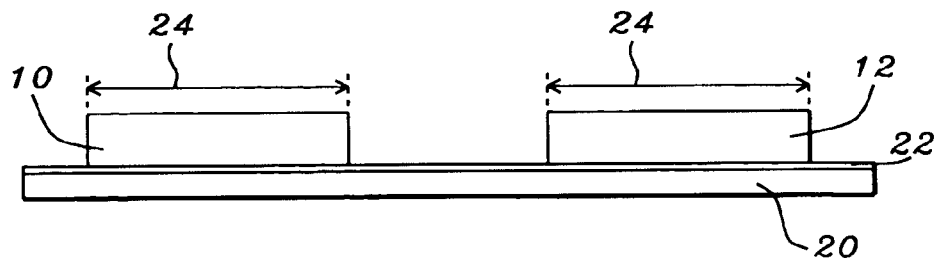
FIG. 2B shows a front view of the dipole antenna of FIG. 1 showing insulating material between both the radiating antenna element and the counterpoise antenna element and a ground plane.

FIG. 2A shows a front view of the dipole antenna of FIG. 1 for the example of an antenna using a ground plane 20, a layer of insulating material 22 between the radiating antenna element 12 and the ground plane 20, and the counterpoise antenna element 10 placed directly on the ground plane 20. FIG. 2B shows a front view of the dipole antenna of FIG. 1 for the example of an antenna using a ground plane 20 and a layer of insulating material 22 between both the radiating antenna element 12 and the counterpoise antenna element 10.

Figure 2C:
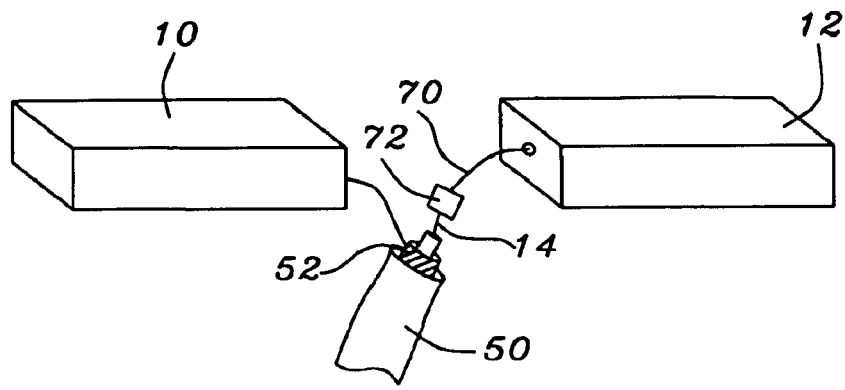
FIG. 2C shows an amplifier inserted between the radiating antenna element and the coaxial cable center conductor for the dipole antenna of FIG. 1.

As shown in FIG. 2C, an amplifier 72 can be inserted between the center conductor 14 of the coaxial cable and the radiating antenna element 12. A wire 70 connects metal insert 15 in the radiating antenna element 12 to the amplifier 72. For receiving antennas the input of the amplifier 72 is connected to the radiating antenna element 12 and the output of the amplifier 72 is connected to the center conductor 14 of the coaxial cable 50. For transmitting antennas the output of the amplifier 72 is connected to the radiating antenna element 12 and the input of the amplifier 72 is connected to the center conductor 14 of the coaxial cable 50.

In one example of this antenna the length 24 is about 1.5 inches with a square cross section of about 0.09 square inches. This antenna had a center frequency of about 900 MHz.

Figure 4A:
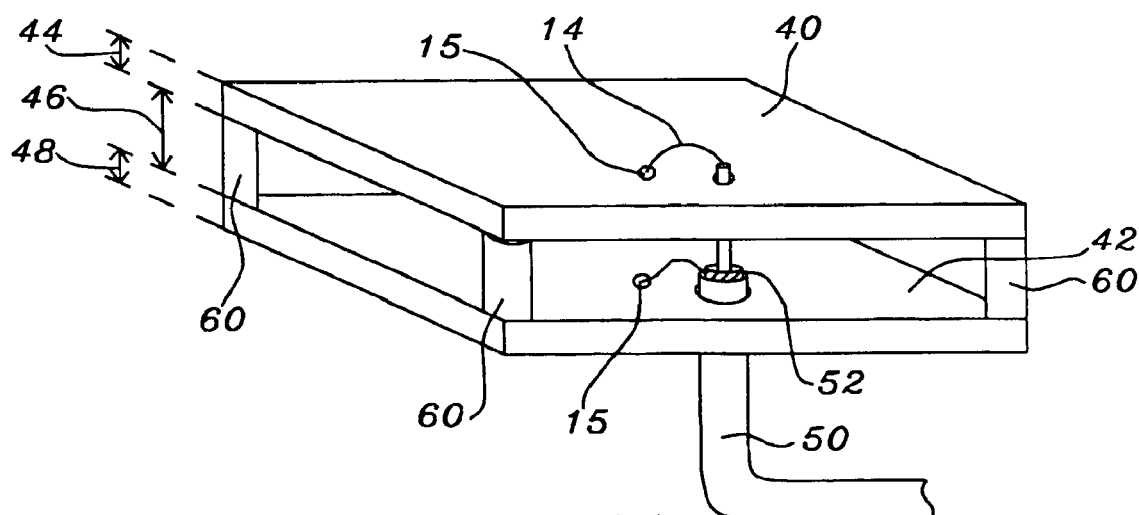
FIG. 4A shows a perspective view of a patch antenna comprising a radiating antenna element and a ground plane with the coaxial cable entering through the ground plane.
Figure 4B:
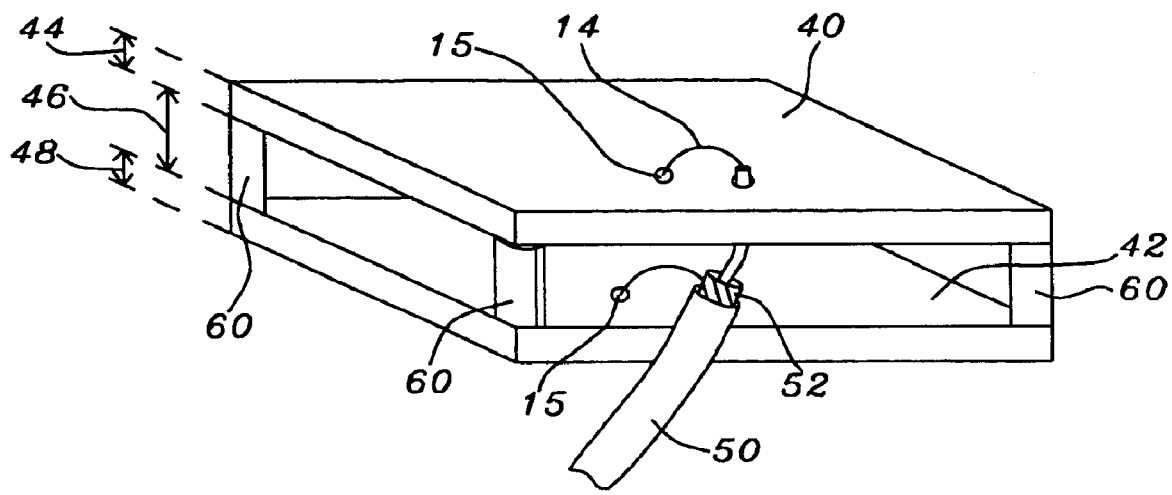
FIG. 4B shows a perspective view of a patch antenna comprising a radiating antenna element and a ground plane with the coaxial cable entering between the ground plane and the radiating antenna element.

FIGS. 4A and 4B show perspective views of a patch antenna with a radiating antenna element 40 and a ground plane 42 formed from conductive loaded resin-based materials. The antenna comprises a radiating antenna element 40 and a ground plane 42 each having the shape of a rectangular plate with a thickness 44 and a separation between the plates 46 provided by insulating standoffs 60. The square root of the area of the rectangular square plate forming the radiating antenna element 40 is greater than three multiplied by the thickness 44. In one example of this antenna wherein the rectangular plate is a square with sides of 1.4 inches and a thickness of 0.41 inches the patch antenna provided good performance at Global Position System, GPS, frequencies of about 1.5 GHz.

FIG. 4A shows an example of the patch antenna where the coaxial cable 50 enters through the ground plane 42. The coaxial cable shield 52 is connected to the ground plane 42 by means of a metal insert 15 in the ground plane. The coaxial cable center conductor 14 is connected to the radiating antenna element 40 by means of a metal insert 15 in the radiating antenna element 40. FIG. 4B shows an example of the patch antenna where the coaxial cable 50 enters between the radiating antenna element 40 and the ground plane 42. The coaxial cable shield 52 is connected to the ground plane 42 by means of a metal insert 15 in the ground plane 42. The coaxial cable center conductor 14 is connected to the radiating antenna element 40 by means of a metal insert 15 in the radiating antenna element 40.

Figure 5:
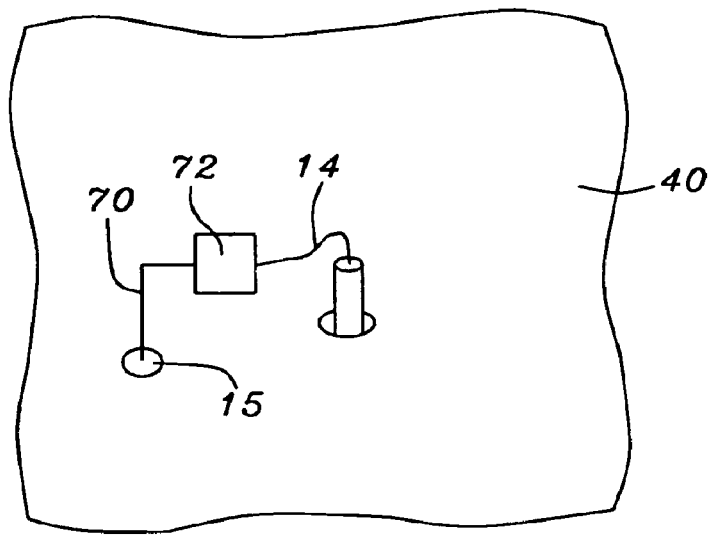
FIG. 5 shows an amplifier inserted between the radiating antenna element and the coaxial cable center conductor for the patch antenna of FIGS. 4A and 4B.

As shown in FIG. 5 an amplifier 72 can be inserted between the coaxial cable center conductor 14 and the radiating antenna element 40. A wire 70 connects the amplifier 72 to the metal insert 15 in the radiating antenna element 40. For receiving antennas the input of the amplifier 72 is connected to the radiating antenna element 40 and the output of the amplifier 72 is connected to the center conductor 14 of the coaxial cable 50. For transmitting antennas the output of the amplifier 72 is connected to the radiating antenna element 40 and the input of the amplifier 72 is connected to the center conductor 14 of the coaxial cable 50.

Figure 6:
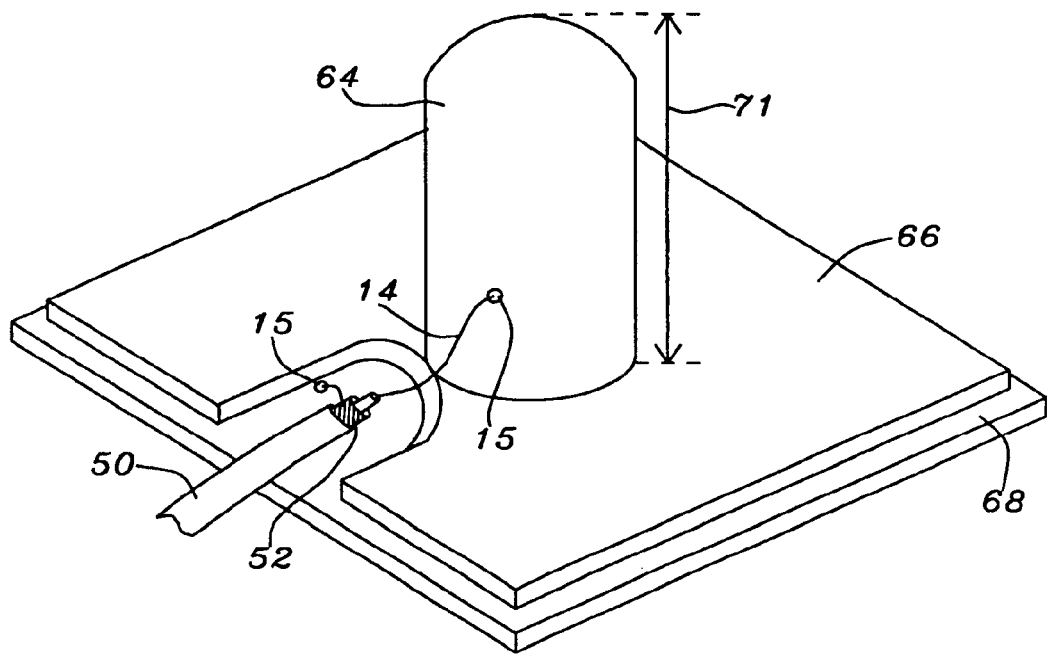
FIG. 6 shows a perspective view of a monopole antenna formed from a conductive loaded resin-based material.

FIG. 6 shows an example of a monopole antenna having a radiating antenna element 64, having a height 71, arranged perpendicular to a ground plane 68. The radiating antenna element 64 and the ground plane 68 are formed of conductive loaded resin-based materials. A layer of insulating material 66 separates the radiating antenna element 64 from the ground plane 68. The height 71 of the radiating antenna element 64 is greater than three times the square root of the cross sectional area of the radiating antenna element 64. An example of this antenna with a height 71 of 1.17 inches performed well at a GPS frequency of 1.575.42 GHz.

Figure 7:
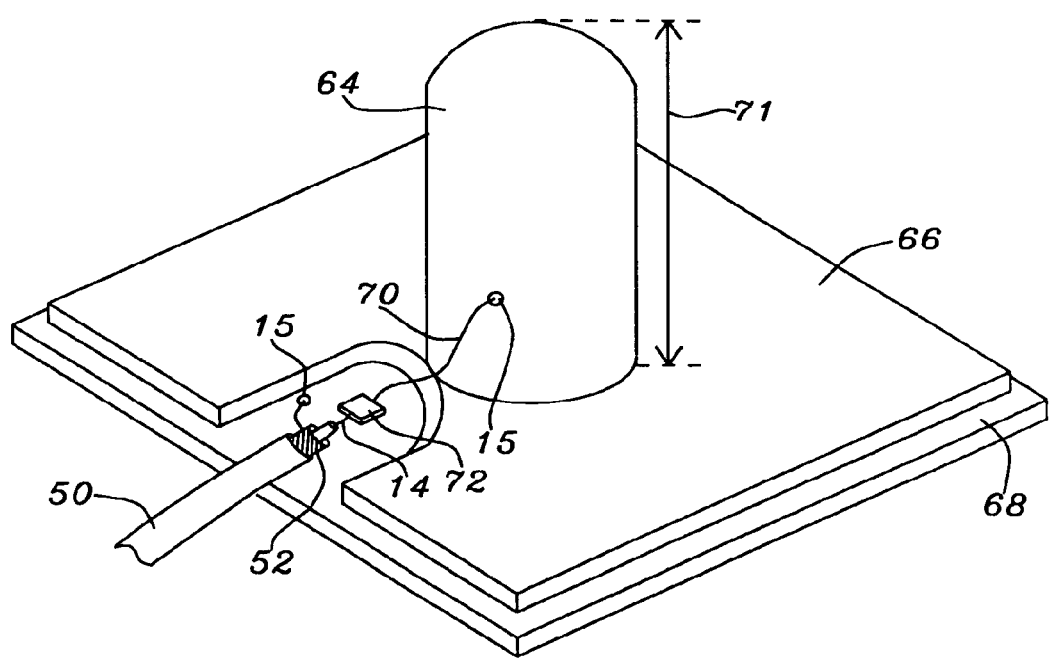
FIG. 7 shows a perspective view of a monopole antenna formed from a conductive loaded resin-based material with an amplifier between the radiating antenna element and the coaxial cable center conductor.

FIG. 7 shows an example of the monopole antenna described above with an amplifier 72 inserted between the center conductor 14 of the coaxial cable 50 and the radiating antenna element 64. For receiving antennas the input of the amplifier 72 is connected to the radiating antenna element 64 and the output of the amplifier 72 is connected to the center conductor 14 of the coaxial cable 50. For transmitting antennas the output of the amplifier 72 is connected to the radiating antenna element 64 and the input of the amplifier 72 is connected to the center conductor 14 of the coaxial cable 50.

Figure 8A:
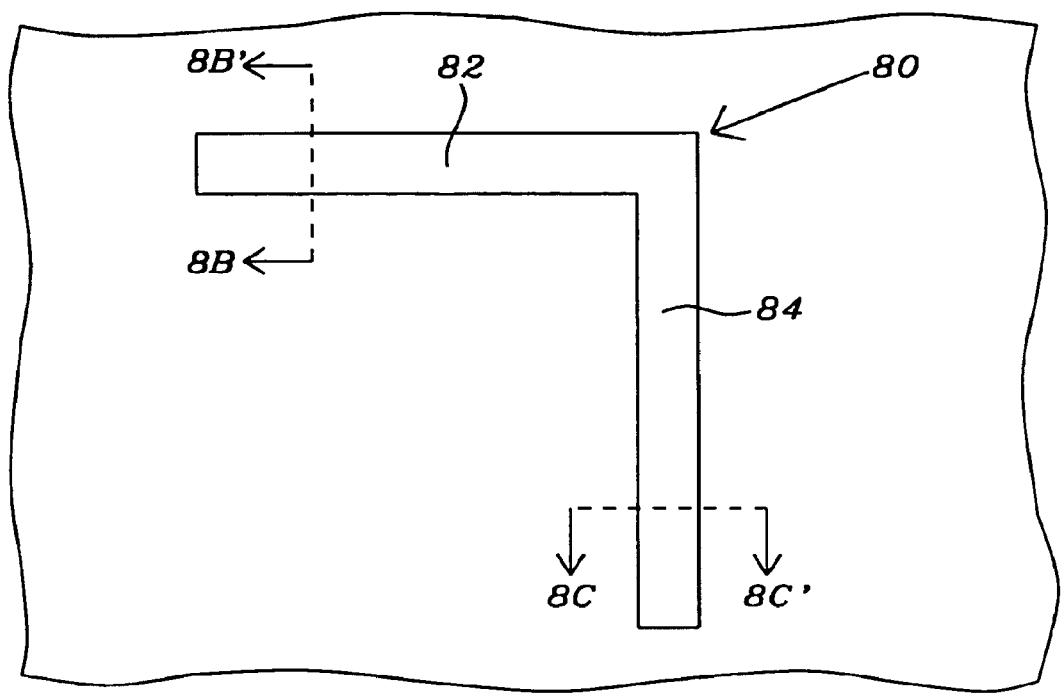
FIG. 8A shows a top view of an antenna having a single L shaped antenna element formed from a conductive loaded resin-based material.
Figure 8B:
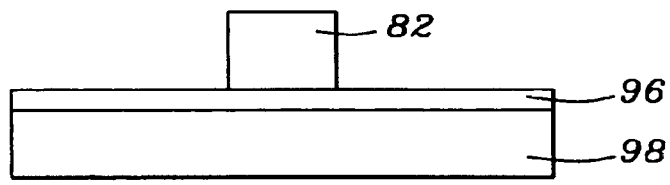
FIG. 8B shows a cross section view of the antenna element of FIG. 8A taken along line 8B–8B' of FIG. 8A.
Figure 8C:
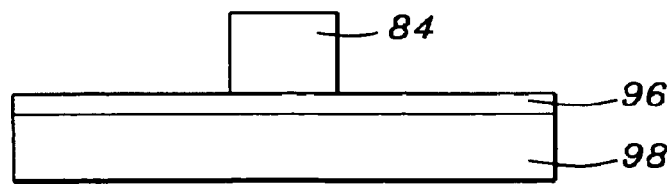
FIG. 8C shows a cross section view of the antenna element of FIG. 8A taken along line 8C–8C' of FIG. 8A.

FIGS. 8A, 8B, and 8C shows an example of an L shaped antenna having a radiating antenna element 80 over a ground plane 98. The radiating antenna element 80 and the ground plane 98 are formed of conductive loaded resin-based materials. A layer of insulating material 96 separates the radiating antenna element 64 from the ground plane 98. The radiating antenna element 80 is made up of a first leg 82 and a second leg 84. FIG. 8A shows a top view of the antenna. FIG. 8B shows a cross section of the first leg 82. FIG. 8C shows a cross section of the second leg 84. FIGS. 8B and 8C show the ground plane 98 and the layer of insulating material 96. The cross sectional area of the first leg 82 and the second leg 84 need not be the same. Antennas of this type may be typically built using overmolding technique to join the conductive resin-based material to the insulating material.

Figure 9A:
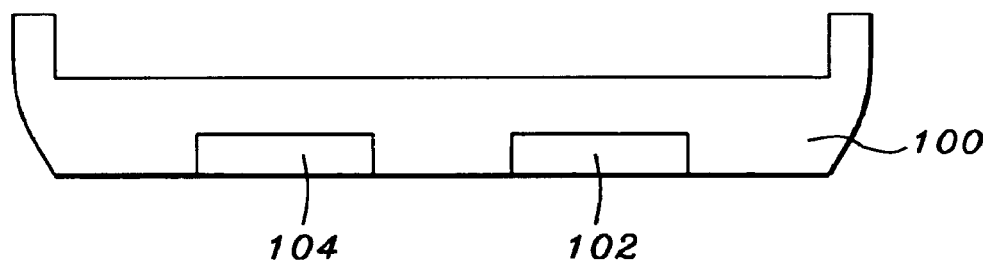
FIG. 9A shows a top view of an antenna formed from a conductive loaded resin-based material embedded in an automobile bumper.
Figure 9B:
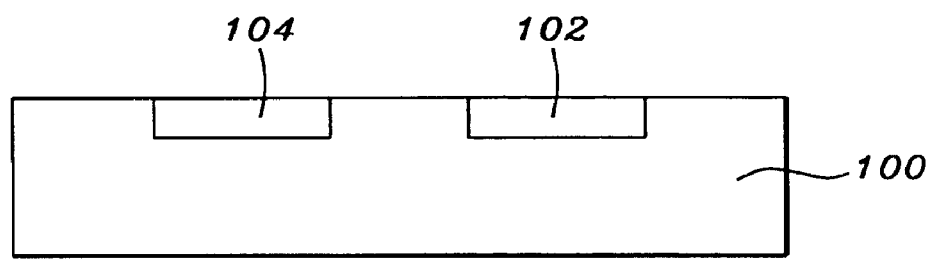
FIG. 9B shows a front view of an antenna formed from a conductive loaded resin-based material embedded in an automobile bumper formed of an insulator such as rubber.

Antennas of this type have a number of uses. FIGS. 9A and 9B show a dipole antenna, formed of conductive loaded resin-based materials, embedded in an automobile bumper 100, formed of insulating material. The dipole antenna has a radiating antenna element 102 and a counterpoise antenna element 104. FIG. 9A shows the top view of the bumper 100 with the embedded antenna. FIG. 9B shows the front view of the bumper 100 with the embedded antenna.

Figure 10A:
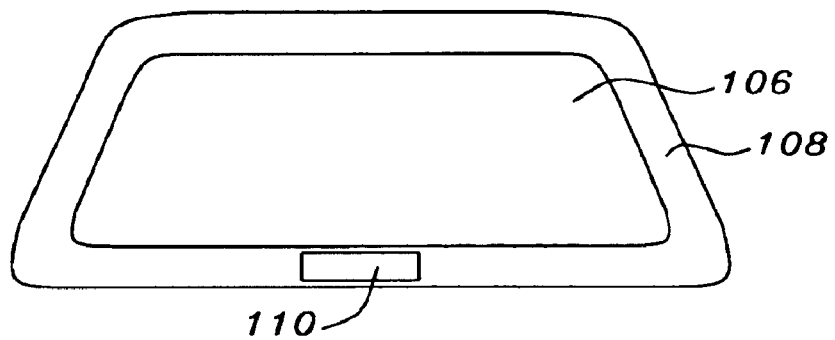
FIG. 10A shows a schematic view of an antenna formed from a conductive loaded resin-based material embedded in the molding of a vehicle window.
Figure 10B:
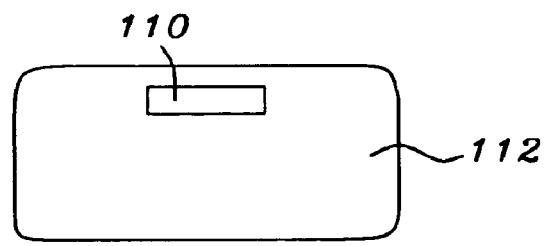
FIG. 10B shows a schematic view of an antenna formed from a conductive loaded resin-based material embedded in the case of a portable electronic device.

The antennas of this invention, formed of conductive loaded resin-based materials, can be used for a number of additional applications. Antennas of this type can be embedded in the molding of a window of a vehicle, such as an automobile or an airplane. FIG. 10A shows a schematic view of such a window 106. The antenna 110 can be embedded in the molding 108. Antennas of this type can be embedded in the plastic housing, or be part of the plastic shell itself, of portable electronic devices such as cellular phones, personal computers, or the like. FIG. 10B shows a schematic view of a segment 112 of such a plastic housing with the antenna 110 molded or inserted in the housing 112.

Figure 11:
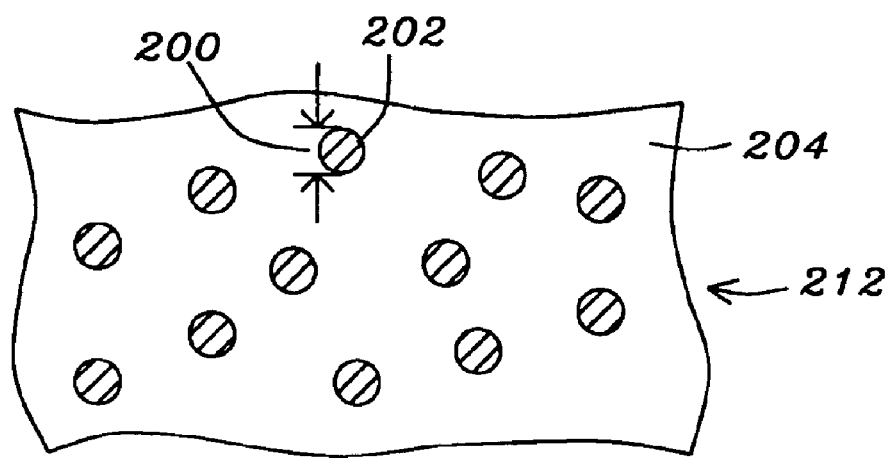
FIG. 11 shows a cross section view of a conductive loaded resin-based material comprising a powder of conductor materials.
Figure 12A:
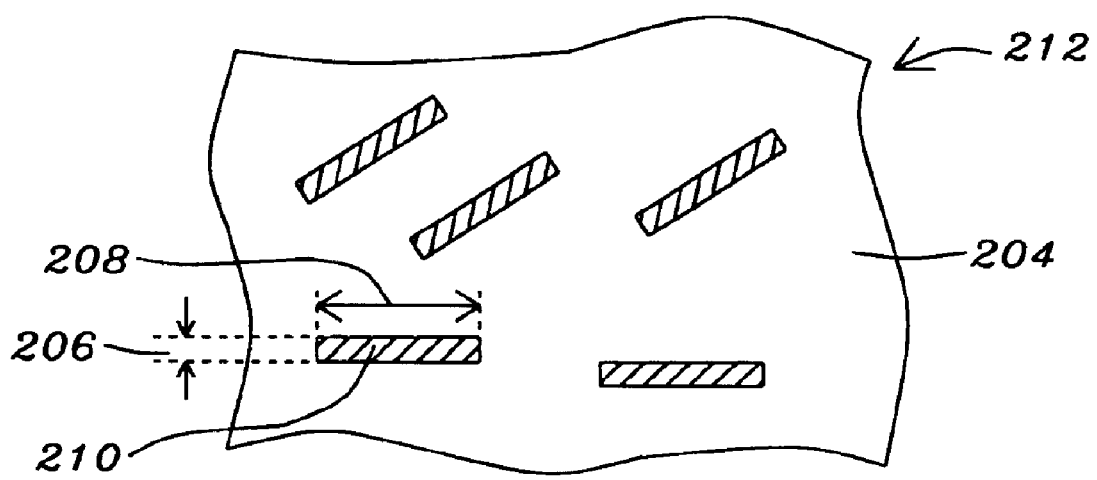
FIG. 12A shows a cross section view of a conductive loaded resin-based material comprising conductor fibers.
Figure 12B:
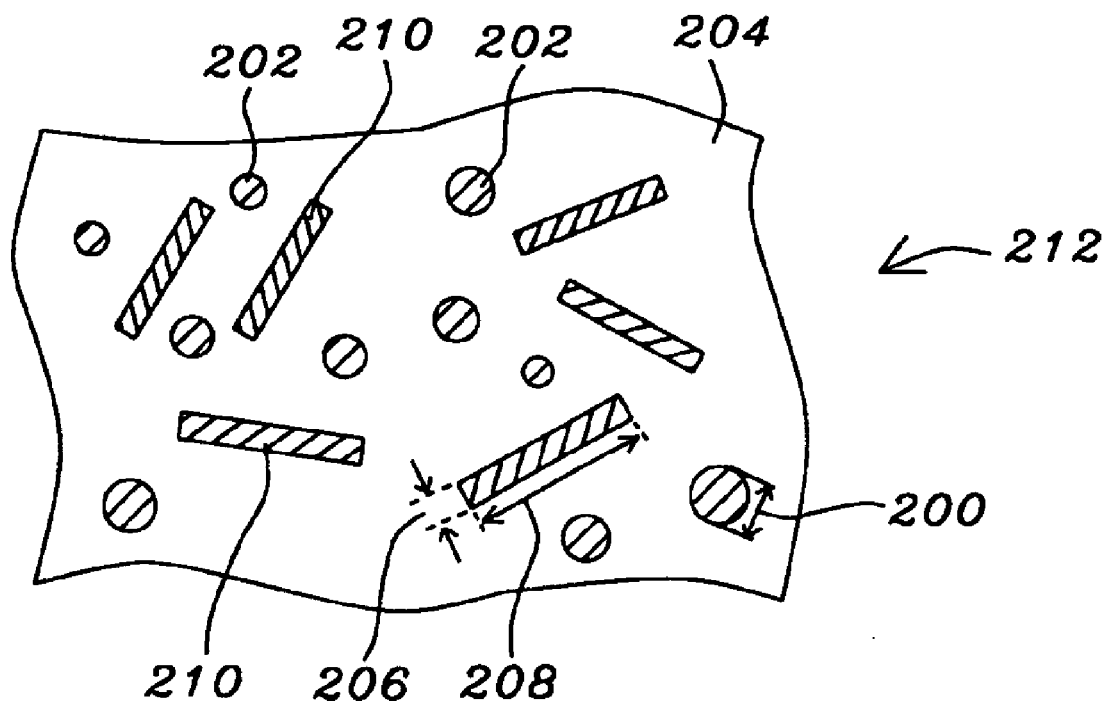
FIG. 12B shows a cross section view of a conductive loaded resin-based material comprising both micron conductor powder and micron conductor fibers.

The conductive loaded resin-based material typically comprises a powder of conductor particles, fibers of a conductor material, or a combination thereof in a base resin host. FIG. 11 shows cross section view of an example of conductor loaded resin-based material 212 having powder of conductor particles 202 in a base resin host 204. FIG. 12A shows a cross section view of an example of conductor loaded resin-based material 212 having conductor fibers 210 in a base resin host 204. FIG. 12B shows a cross section view of an example of conductor loaded resin-based material 212 having a powder of conductor particles 202 and conductor fibers 210 in a base resin host 204. In these examples the diameters 200 of the conductor particles 202 in the powder are between about 3 and 12 microns. In these examples the conductor fibers 210 have diameters of between about 3 and 12 microns, typically in the range of 10 microns or between about 8 and 12 microns, and lengths of between about 2 and 14 millimeters. The conductors used for these conductor particles 202 or conductor fibers 210 can be stainless steel, nickel, copper, silver, graphite, plated particles, plated fibers, or other suitable metals or resin. These conductor particles or fibers are homogenized within a base resin. As previously mentioned, the conductive loaded resin-based materials have a conductivity between about less than 5 and up to greater than 25 ohms per square. To realize this conductivity the ratio of the weight of the conductor material, in this example the conductor particles 202 or conductor fibers 210, to the weight of the base resin host 204 is between about 0.20 and 0.40. Stainless Steel Fiber of 8–11 micron in diameter and lengths of 4–6 mm with a fiber weight to base resin weight ration of 0.30 will produce a very highly conductive parameter efficient within any EMF spectrum.

Figure 13:
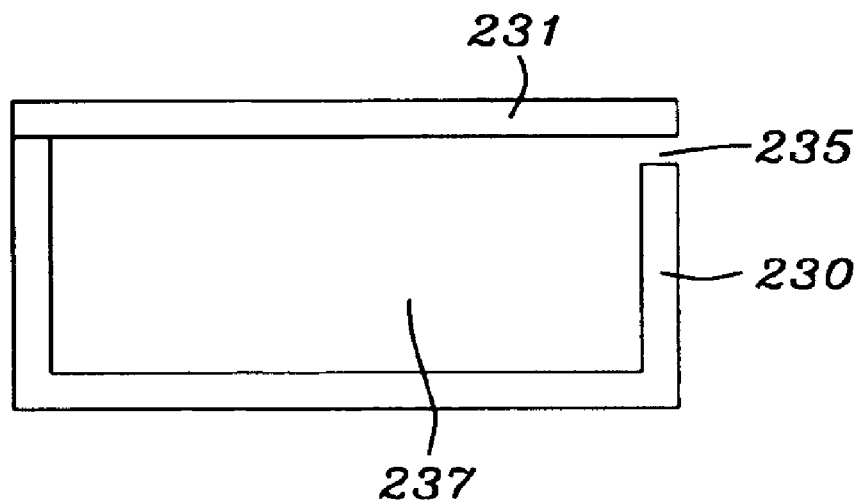
FIG. 13 shows a simplified schematic view of an apparatus for forming injection molded antenna elements.

Package elements, antenna elements, or EMF absorbing elements formed from conductive loaded resin-based materials can be formed or molded in a number of different ways including injection molding, extrusion, or chemically induced molding. FIG. 13 shows a simplified schematic diagram of an injection mold showing a lower portion 230 and upper portion 231 of the mold. Raw material conductive loaded blended resin-based material is injected into the mold cavity 237 through an injection opening 235 and then homogenized with the conductive loading material(s) and cured thermally. The upper portion 231 and lower portion 230 of the mold are then separated and the then conductive antenna element is removed.

Figure 14:
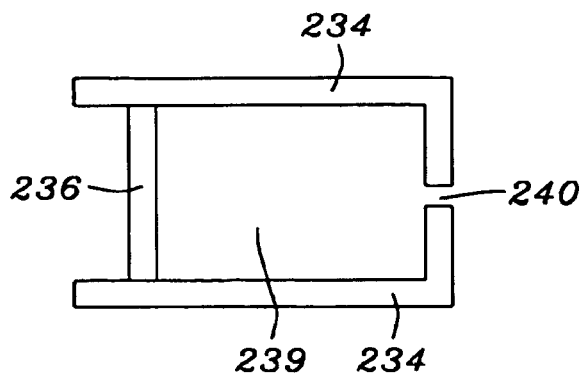
FIG. 14 shows a simplified schematic view of an apparatus for forming extruded antenna elements.

FIG. 14 shows a simplified schematic diagram of an extruder for forming antenna elements using extrusion. Raw material(s) conductive loaded resin-based material is placed in the hopper 239 of the extrusion unit 234. A piston, screw, press, or other means 236 is then used to force the thermally molten or a chemically induced curing conductive loaded resin-based material through an extrusion opening 240 which shapes the thermally molten or chemically induced cured conductive loaded resin-based material to the desired shape. The conductive loaded resin-based material is then fully cured by chemical reaction or thermal reaction to a hardened or pliable state and is ready for use.

Figure 15A:
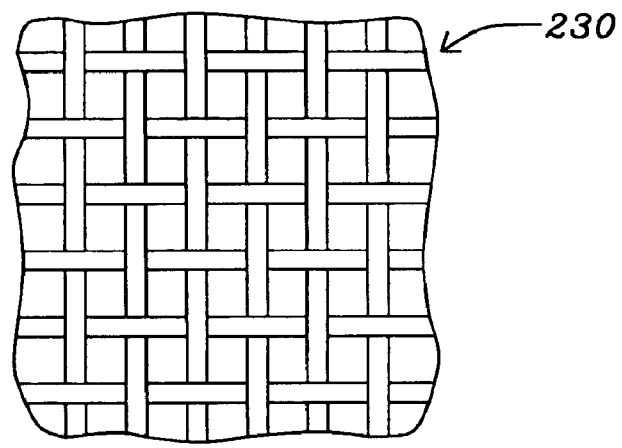
FIG. 15A shows a top view of fibers of conductive loaded resin-based material woven into a conductive fabric.
Figure 15B:
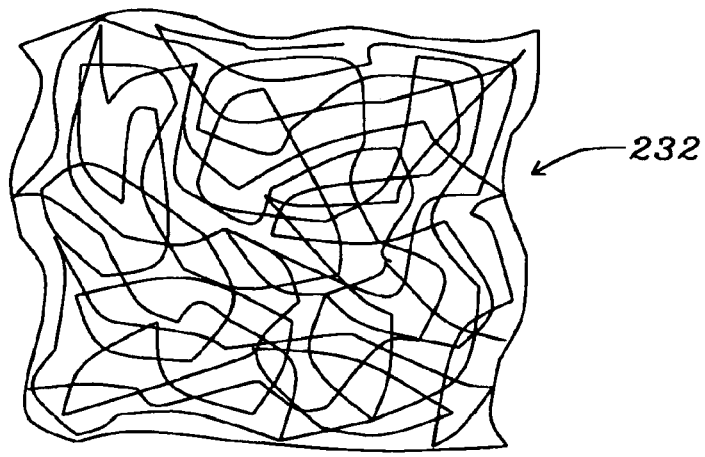
FIG. 15B shows a top view of fibers of conductive loaded resin-based material randomly webbed into a conductive fabric.

Referring now to FIGS. 15A and 15B, a preferred composition of the conductive loaded, resin-based material is illustrated. The conductive loaded resin based material can be formed into fibers or textiles that are then woven or webbed into a conductive fabric. The conductive loaded resin-based material is formed in strands that can be woven as shown. FIG. 15A shows a conductive fabric 230 where the fibers are woven together in a two-dimensional weave of fibers. FIG. 15B shows a conductive fabric 232 where the fibers are formed in a webbed arrangement. In the webbed arrangement, one or more continuous strands of the conductive fiber are nested in a random fashion within the resin. The resulting conductive fabrics 230, see FIG. 15A, and 232, see FIG. 15B, can be made very thin.

Similarly, a family of polyesters or the like can be formed using woven or webbed micron stainless steel fibers, or other micron conductive fibers, to create a metallic, but cloth-like, material. These woven or webbed conductive cloths could also be laminated to one or more layers of materials such as polyester, Teflon, or other resin-based material. This conductive fabric may then be cut into desired shapes.

Figure 16A:
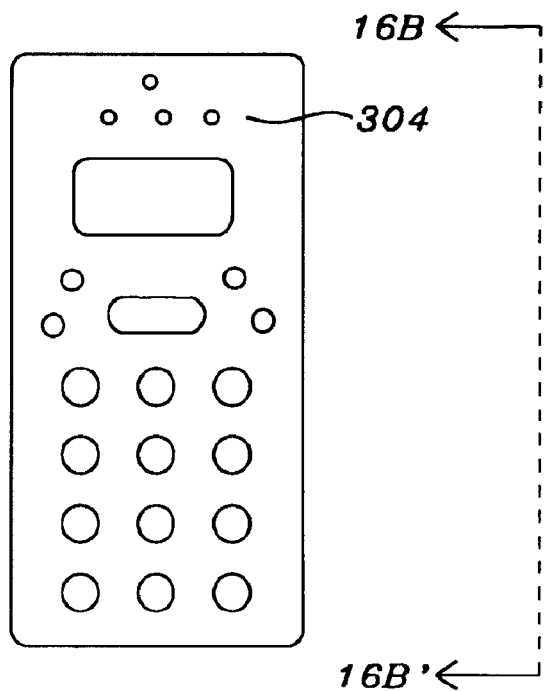
FIGS. 16A, 16B, and 16C show a top view, a side view, and a cross section view respectively of a casing for a wireless electronic communication system.
Figure 16B:
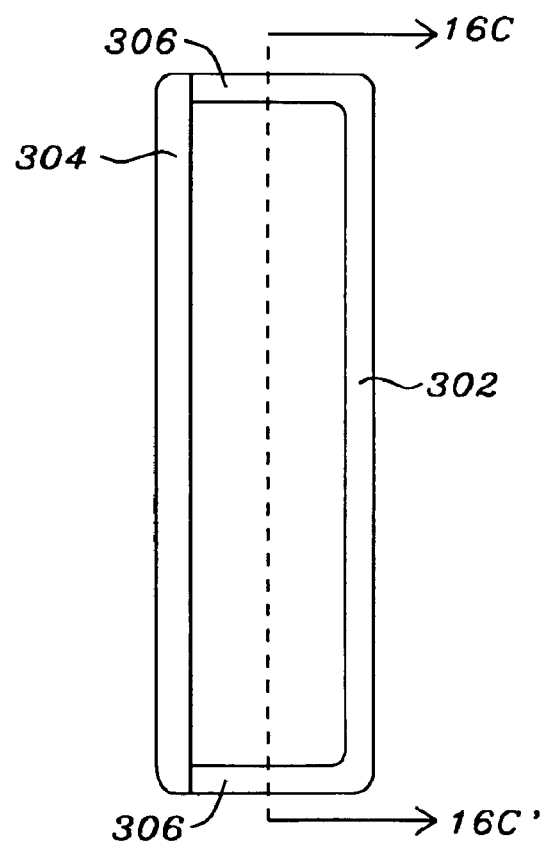
Figure 16C:
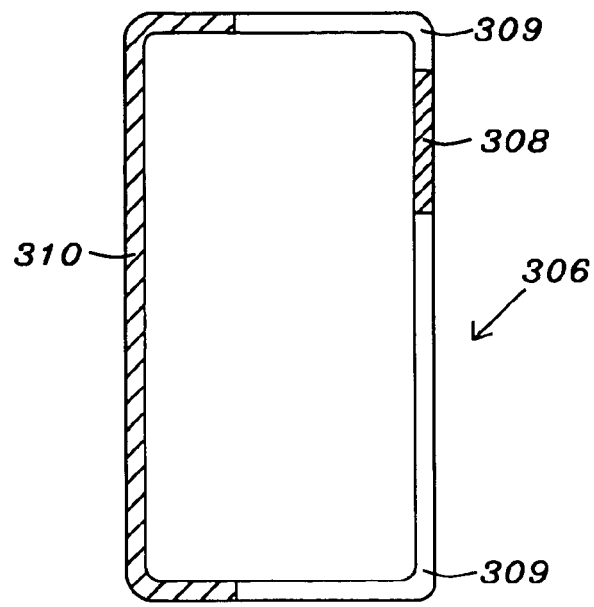

FIG. 16A shows a top view of a casing for an electronic communication device, such as a cell phone, all or part of which is formed of conductive loaded resin-based material. FIG. 16A shows the top element 304 of the casing. FIG. 16B shows a side view, as viewed from line 16B–16B' of FIG. 16A, of the casing showing the side element 306 and bottom element 302. Part or all of the top element 304, bottom element 302, and side element 306 can be fabricated from conductive loaded resin-based materials. FIG. 16C shows a cross section view, viewed from line 16C–16C' of FIG. 16B showing segments of the side element 306. As shown in FIG.

16C an antenna element 308 and an EMF absorbing element 310 can be embedded in the side element 306. As shown in FIG. 16C, insulation elements 309 must be used to insulate the antenna element 308 from the EMF absorbing element 310.

Figure 17A:
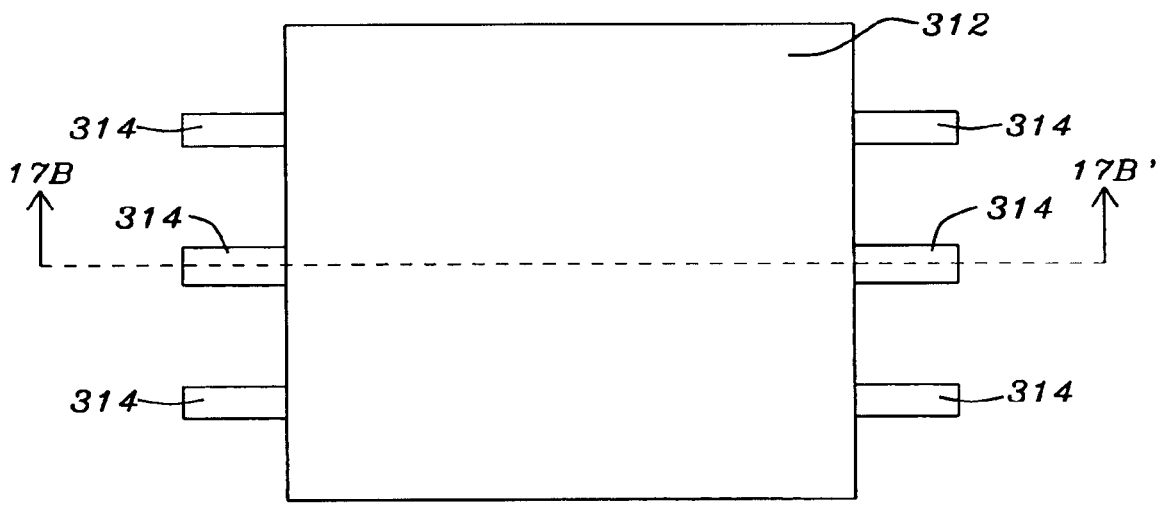
FIGS. 17A and 17B show a top view and a cross section view respectively of an integrated circuit package.
Figure 17B:
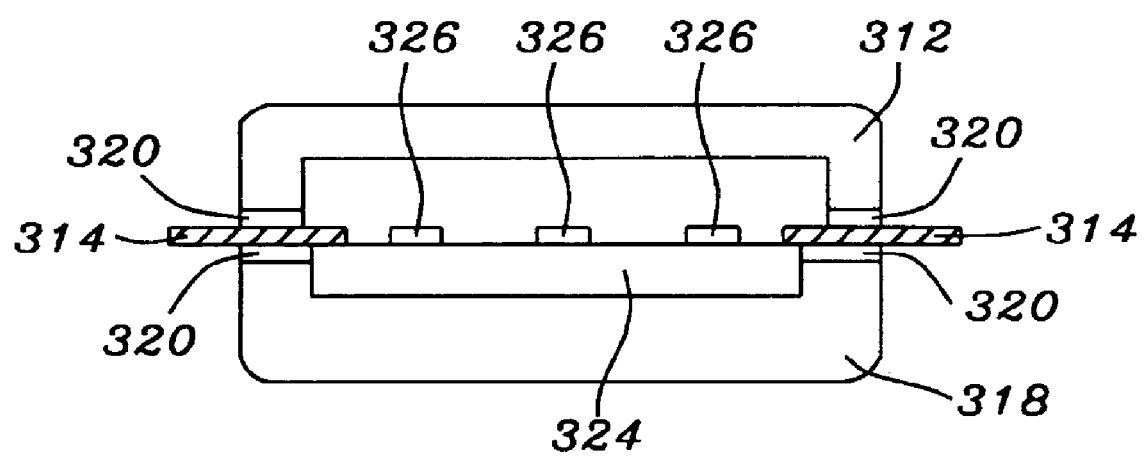

FIG. 17A shows a top view and FIG. 17B shows a cross section view, taken along line 17B–17B' of FIG. 17A, of a EMF absorbing integrated circuit package formed of conductive loaded resin-based material. FIGS. 17A and 17B show a first package element 318 in which an insulating substrate 324 is embedded. A number of integrated circuit elements 326 are mounted on the substrate 324. In the example shown in FIG. 17B three integrated circuit elements are shown as an example however the number of integrated circuit elements could be more or less than three. Electronic circuit traces, not shown, can be formed on the substrate 324 to interconnect the integrated circuit elements 326. Input/output leads 314 are used to bring electrical signals into and out from the integrated circuit elements 326. A second package element 312 then covers the assembly, as shown in FIG. 17B, and is joined to the first package element 318. Insulation material 320 must be used to insulate the input/output leads 314 from both the first package element 318 and the second package element 312. The first package element 318 and the second package element 312, both formed from conductive loaded resin-based materials provide electromagnetic absorption for the assembly in the package.

Antennas formed from the conductive loaded resin-based materials can be designed to work at frequencies from about 2 Kilohertz to about 300 Gigahertz or any other allocated radio frequencies. The geometries scale linearly with the frequencies of application, the higher the frequency the smaller the dimensions. Antennas formed from conductive loaded resin-based materials can receive signals, which are horizontally, vertically, circularly, or cross polarized.

The conductive loaded resin-based materials could also be formed as probes for oscilloscopes and other electronic instruments in place of metal probes.

While the invention has been particularly shown and described with reference to the preferred embodiments thereof, it will be understood by those skilled in the art that various changes in form and details may be made without departing from the spirit and scope of the invention.

What is claimed is:

1. A case or shell for electronic devices, comprising:
a bottom element, a sidewall element, and a top element, wherein part or all of said bottom, part or all of said sidewall element, and part or all of said top are formed of a conductive loaded resin-based material, and wherein said conductive loaded resin-based material comprises conductor fibers, conductor powders, or a combination of said conductor fibers and said conductor powders in a base resin host and the ratio of the weight of said conductor fibers, said conductive powders, or said combination of conductive fibers and conductive powders to the weight of said base resin host is between about 0.20 and 0.40;
an antenna element formed in said sidewall element wherein said antenna element is formed of said conductive loaded resin-based material;
a system having interconnected electronic devices placed within said top element, said sidewall element, and said bottom element; and
electrical connections from said antenna element to said system having interconnected electronic devices.

2. The case or shell of claim 1 wherein said conductor fibers have a cylindrical shape.

3. The case or shell of claim 1 wherein the diameter of said conductor fibers are between about 3 and 12 microns.

4. The case or shell of claim 1 wherein the length of said conductor fibers are between about 2 and 14 millimeters.

5. The case or shell of claim 1 wherein said conductor powders comprise conductor particles having a spherical shape.

6. The case or shell of claim 1 wherein said conductor powders comprise conductor particles having a diameter of between about 3 and 12 microns.

7. The case or shell of claim 1 wherein said system having interconnected electronic devices is a wireless telephone.

8. The case or shell of claim 1 wherein those parts of said bottom element, said sidewall element, and said top which are formed of said conductive loaded resin based material and which are not part of said antenna element provide electromagnetic absorption.

9. The case or shell of claim 1 wherein said conductor fibers are stainless steel, nickel, copper, silver, carbon, graphite, or plated fibers.

10. The case or shell of claim 1 wherein said conductor powders comprise particles of stainless steel, nickel, copper, silver, carbon, graphite, or plated particles.

11. The case or shell of claim 1 wherein said antenna can be designed to operate effectively at frequencies between about 2 Kilohertz and 300 Gigahertz or any usable radio frequency.

12. An electronic circuit package, comprising:
a first package element formed of a conductive loaded resin-based material wherein said conductive loaded resin-based material comprises conductor fibers, conductor powders, or a combination of said conductor fibers and said conductor powders in a base resin host and the ratio of the weight of said conductor fibers, said conductive powders, or said combination of conductive fibers and conductive powders to the weight of said base resin host is between about 0.20 and 0.40;
a substrate formed in said first package element wherein said substrate is an insulator;
integrated circuit elements attached to said substrate;
a second package element formed of said conductive loaded resin-based material, wherein said second package element is attached to said first package element covering said substrate and said integrated circuit elements so that said first package element and said second package element form a protective shell and an electromagnetic absorber around said substrate and said integrated circuit elements;
conducting electrodes between said substrate and the exterior of said protective shell;
insulation between said conducting electrodes and said first package element; and
insulation between said conducting electrodes and said second package element.

13. The electronic circuit package of claim 12 wherein said conductor fibers have a cylindrical shape.

14. The electronic circuit package of claim 12 wherein the diameter of said conductor fibers is between about 3 and 12 microns.

15. The electronic circuit package of claim 12 wherein the length of said conductor fibers is between about 2 and 14 millimeters.

16. The electronic circuit package of claim 12 wherein said conductor powders comprise conductor particles having a spherical shape.

17. The electronic circuit package of claim 12 wherein said conductor powders comprise conductor particles having a diameter of between about 3 and 12 microns.

18. The electronic circuit package of claim 12 wherein said conductor fibers are stainless steel, nickel, copper, silver, carbon, graphite, or plated fibers.

19. The electronic circuit package of claim 12 wherein said conductor powders comprise particles of stainless steel, nickel, copper, silver, carbon, graphite, or plated particles.

20. A method of forming a case or shell for electronic devices, comprising:

forming a bottom element, a sidewall element, and a top element, wherein part or all of said bottom, part or all of said sidewall element, and part or all of said top are formed of a conductive loaded resin-based material, and wherein said conductive loaded resin-based material comprises conductor fibers, conductor powders, or a combination of said conductor fibers and said conductor powders in a base resin host and the ratio of the weight of said conductor fibers, said conductive powders, or said combination of conductive fibers and conductive powders to the weight of said base resin host is between about 0.20 and 0.40;

forming an antenna element in said sidewall element wherein said antenna element is formed of said conductive loaded resin-based material;

placing a system having interconnected electronic devices within said top element, said sidewall element, and said bottom element; and forming electrical connections from said antenna element to said system having interconnected electronic devices.

21. The method of claim 20 wherein said conductor fibers have a cylindrical shape.

22. The method of claim 20 wherein the diameters of said conductor fibers are between about 3 and 12 microns.

23. The method of claim 20 wherein the length of said conductor fibers is between about 2 and 14 millimeters.

24. The method of claim 20 wherein said conductor powders comprise conductor particles having a spherical shape.

25. The method of claim 20 wherein said conductor powders comprise conductor particles having a diameter of between about 3 and 12 microns.

26. The method of claim 20 wherein said system having interconnected electronic devices is a wireless telephone.

27. The method of claim 20 wherein those parts of said bottom element, said sidewall element, and said top which are formed of said conductive loaded resin based material and which are not part of said antenna element provide electromagnetic absorption for said system having electronic devices.

28. The method of claim 20 wherein said conductor fibers are stainless steel, nickel, copper, silver, carbon, graphite, or plated fibers.

29. The method of claim 20 wherein said conductor powders comprise particles of stainless steel, nickel, copper, silver, carbon, graphite, or plated particles.

30. The method of claim 20 wherein said antenna can be designed to operate effectively at frequencies between about 2 Kilohertz and 300 Gigahertz or any usable radio frequency.

31. The method of claim 20 wherein said bottom element, said sidewall element, and said top element are formed using molding, overmolding, or extrusion.

32. A method of forming an electronic circuit package, comprising:

forming a first package element of a conductive loaded resin-based material wherein said conductive loaded resin-based material comprises conductor fibers, conductor powders, or a combination of said conductor fibers and said conductor powders in a base resin host and the ratio of the weight of said conductor fibers, said conductive powders, or said combination of conductive fibers and conductive powders to the weight of said base resin host is between about 0.20 and 0.40;

placing a substrate in said first package element wherein said substrate is an insulator;

attaching integrated circuit elements to said substrate;

forming a second package element of said conductive loaded resin-based material, wherein said second package element is attached to said first package element covering said substrate and said integrated circuit elements so that said first package element and said second package element form a protective shell and an electromagnetic shield around said substrate and said integrated circuit elements;

attaching conducting electrodes between said substrate and the exterior of said protective shell;

placing insulation between said conducting electrodes and said first package element; and placing insulation between said conducting electrodes and said second package element.

33. The method of claim 32 wherein said conductor fibers have a cylindrical shape.

34. The method of claim 32 wherein the diameters of said conductor fibers are between about 3 and 12 microns.

35. The method of claim 32 wherein the lengths of said conductor fibers are between about 2 and 14 millimeters.

36. The method of claim 32 wherein said conductor powders comprise conductor particles having a spherical shape.

37. The method of claim 32 wherein said conductor powders comprise conductor particles having a diameter of between about 3 and 12 microns.

38. The method of claim 32 wherein said conductor fibers are stainless steel, nickel, copper, silver, carbon, graphite, or plated fibers.

39. The method of claim 32 wherein said conductor powders comprise particles of stainless steel, nickel, copper, silver, carbon, graphite, or plated particles.

40. The method of claim 32 wherein said first package element and said second package element are formed using molding, overmolding, or extrusion.

* * * * *